United States Patent
Lin et al.

(10) Patent No.: US 9,013,042 B2
(45) Date of Patent: Apr. 21, 2015

(54) INTERCONNECTION STRUCTURE FOR SEMICONDUCTOR PACKAGE

(71) Applicant: Siliconware Precision Industries Co., Ltd., Taichung Hsien (TW)

(72) Inventors: Chang-Fu Lin, Taichung Hsien (TW); Ho-Yi Tsai, Taichung (TW); Chin-Tsai Yao, Taichung Hsien (TW); Jui-Chung Ho, Taichung Hsien (TW); Ching-Hui Hung, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/677,861

(22) Filed: Nov. 15, 2012

(65) Prior Publication Data
US 2014/0061928 A1    Mar. 6, 2014

(30) Foreign Application Priority Data

Sep. 3, 2012   (TW) .............................. 101131977 A

(51) Int. Cl.
| | |
|---|---|
| H01L 23/48 | (2006.01) |
| H01L 23/52 | (2006.01) |
| H01L 29/40 | (2006.01) |
| H01L 23/532 | (2006.01) |
| H01L 23/00 | (2006.01) |

(52) U.S. Cl.
CPC .......... *H01L 23/53204* (2013.01); *H01L 24/00* (2013.01)

(58) Field of Classification Search
CPC .................................................. H01L 23/53204
USPC .......................... 257/743, 741, 750, 762–766
See application file for complete search history.

(56) References Cited

U.S. PATENT DOCUMENTS

| | | | | |
|---|---|---|---|---|
| 6,424,036 | B1 * | 7/2002 | Okada ........................... | 257/734 |
| 6,819,002 | B2 * | 11/2004 | Chen et al. ..................... | 257/779 |
| 7,709,954 | B2 * | 5/2010 | Loo ................................ | 257/738 |
| 8,575,018 | B2 * | 11/2013 | Lin et al. ........................ | 438/613 |
| 2003/0214037 | A1 * | 11/2003 | Tellkamp ....................... | 257/738 |
| 2006/0051954 | A1 * | 3/2006 | Lin et al. ........................ | 438/614 |

\* cited by examiner

*Primary Examiner* — David S Blum
(74) *Attorney, Agent, or Firm* — Mintz Levin Cohn Ferris Glovsky and Popeo, P.C.; Peter F. Corless; Steven M. Jensen

(57) ABSTRACT

An interconnection structure for being formed on bonding pads of a substrate in a semiconductor package is provided. The interconnection structure includes a nickel layer formed on each of the bonding pads, a metal layer formed on the nickel layer, and a solder material formed on the metal layer. The metal layer is made of one of gold, silver, lead and copper, and has a thickness in the range of 0.5 to 5 um. As such, when the solder material is reflowed to form solder bumps, no nickel-tin compound is formed between the solder bumps and the metal layer, thereby avoiding cracking or delamination of the solder bumps.

11 Claims, 1 Drawing Sheet

INTERCONNECTION STRUCTURE FOR SEMICONDUCTOR PACKAGE

CROSS REFERENCE TO RELATED APPLICATIONS

This application claims under 35 U.S.C. §119(a) the benefit of Taiwanese Application No. 101131977, filed Sep. 3, 2012, the entire contents of which is incorporated herein by reference.

BACKGROUND OF THE INVENTION

1. Field of the Invention

The present invention relates to interconnection structures, and, more particularly, to an interconnection structure for a semiconductor package.

2. Description of Related Art

To meet the trend of multi-function and high electrical performance of electronic products, various types of structures have been developed for semiconductor packages. For example, a semiconductor element is disposed on and electrically connected to a packaging substrate through a plurality of solder bumps and then encapsulated to form a semiconductor package. The semiconductor element has a plurality of bonding pads, and the packaging substrate has a plurality of conductive pads. The bonding pads of the semiconductor element are aligned with and electrically connected to the conductive pads of the packaging substrate through the solder bumps.

Referring to FIG. 1, a substrate 30 such as a semiconductor chip having a plurality of bonding pads 300 made of aluminum (only one bonding pad 300 is shown) is provided. An insulating layer 301 is formed on the substrate 30, and a plurality of openings are formed in the insulating layer 301 for exposing the bonding pads 300. A titanium layer 11, a copper layer 12, and a nickel layer 13 are sequentially formed on the bonding pads 300 to serve as an under bump metallurgy (UBM) layer, and then a solder material 15 is formed on the nickel layer 13. As such, the titanium layer 11, the copper layer 12, the nickel layer 13, and the solder material 15 form an interconnection structure 1. The solder material 15 is reflowed to form solder bumps. During the reflow process, an intermetallic compound 13' is formed at interfaces between the nickel layer 13 and the solder bumps.

Conventionally, the intermetallic compound 13' is a nickel-tin compound ($Ni_xSn_y$) such as $Ni_3Sn_4$. The intermetallic compound 13' is brittle, and easily impairs the mechanical strength, the lifetime and the fatigue strength of the solder bumps. Therefore, bump cracking or delamination is likely found in a reliability test at the interfaces between the UBM layer and the solder bumps, thereby reducing the product yield.

Therefore, how to overcome the above-described drawbacks has become critical.

SUMMARY OF THE INVENTION

Accordingly, the present invention provides an interconnection structure for being formed on bonding pads of a substrate in a semiconductor package. The interconnection structure comprises: a nickel layer formed on each of the bonding pads; and a metal layer formed on the nickel layer, wherein the metal layer is made of one of gold, silver, lead and copper, and has a thickness in the range of 0.5 to 5 um.

In an embodiment, the nickel layer has a thickness of 3 um.

In an embodiment, the interconnection structure further comprises a titanium layer formed between the bonding pad and the nickel layer and having a thickness less than a thickness of the nickel layer. In an embodiment, the titanium layer has a thickness of 0.3 um.

In an embodiment, the interconnection structure further comprises a copper layer formed between the bonding pad and the nickel layer and having a thickness less than a thickness of the nickel layer. In an embodiment, the copper layer has a thickness of 0.3 um.

In an embodiment, the interconnection structure further comprises a titanium layer formed between the bonding pad and the nickel layer and a copper layer formed between the titanium layer and the nickel layer, and the thickness of the nickel layer is greater than the thickness of the titanium layer and the thickness of the copper layer.

In an embodiment, the interconnection structure further comprises a solder material formed on the metal layer.

Therefore, by forming a metal layer made of one of gold, silver, lead and copper between the nickel layer and the solder material, the present invention prevents the generation of nickel-tin compounds during a reflow process of the solder material, thereby effectively avoiding cracking or delamination of solder bumps.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms, such as "on", "first", "second" "a" etc., are only used as a matter of descriptive convenience and not intended to have any other significance or provide limitations for the present invention.

Figure 1:
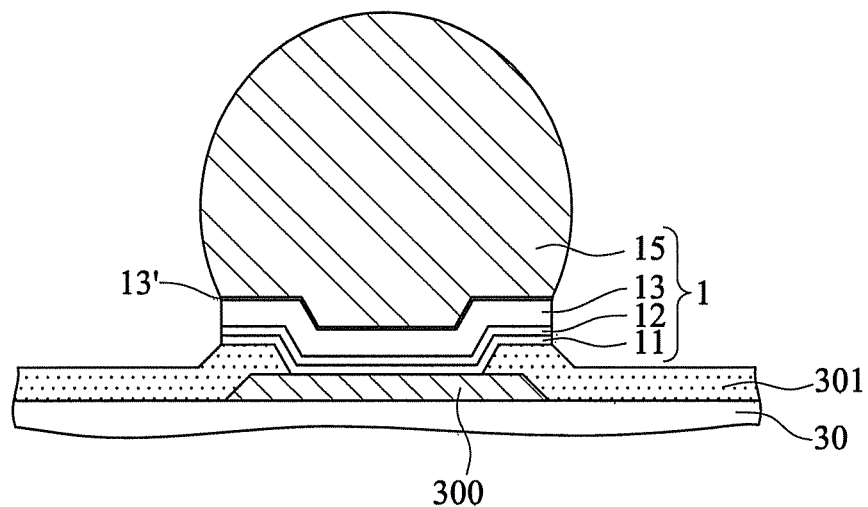
FIG. 1 is a cross-sectional view showing a conventional interconnection structure for a semiconductor package.
Figure 2:
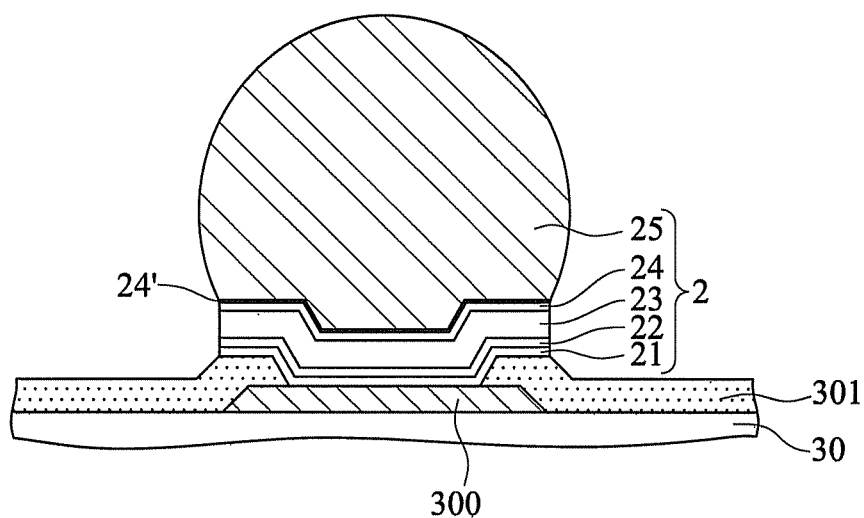
FIG. 2 is a cross-sectional view showing an interconnection structure for a semiconductor package according to the present invention.

FIG. 2 is a cross-sectional view showing an interconnection structure 2 for a semiconductor package according to the present invention.

The interconnection structure 2 is formed on a plurality of bonding pads 300 of a substrate 30 in the semiconductor package. The interconnection structure 2 has a titanium layer 21, a copper layer 22 formed on the titanium layer 21, a nickel layer 23 formed on the copper layer 22, a metal layer 24 formed on the nickel layer 23, and a solder material 25 formed on the metal layer 24.

In an embodiment, the substrate 30 is a semiconductor chip. An insulating layer 301 is formed on the substrate 30, and the bonding pads 300 are exposed from the insulating layer 301, so as for a UBM layer to be formed thereon. In an embodiment, the bonding pads 300 are made of aluminum. The UBM layer has a titanium layer 21, a copper layer 22 formed on the titanium layer 21, a nickel layer 23 formed on the copper layer 22, and a metal layer 24 formed on the nickel layer 23.

The titanium layer 21 is formed on each of the bonding pads 300 and has a thickness of 0.3 um.

The copper layer 22 is formed on the titanium layer 21 and has a thickness of 0.3 um.

The nickel layer 23 is formed on the copper layer 22 and has a thickness greater than the thickness of the titanium layer 21 and the thickness of the copper layer 22. In an embodiment, the nickel layer 23 has a thickness of 3 um.

The metal layer 24 is formed on the nickel layer 23. The metal layer 24 is not made of nickel or solder. In an embodiment, the metal layer 24 is made of copper. That is, the copper layer 22 can be referred to as a first copper layer, and the metal layer 24 can be referred to as a second copper layer. The metal layer 24 has a thickness in the range of 0.5 to 5 um.

The solder material 25 is formed on the metal layer 24. In an embodiment, the solder material 25 is made of a tin-silver alloy fabricated in a lead-free environment. In other embodiments, the solder material 25 is made of a lead-free SnAgCu (SAC) paste.

When the solder material 25 is reflowed to form solder bumps, an intermetallic compound 24' is formed at an interface between the solder material 25 and the metal layer 24. The intermetallic compound 24' is a copper-tin compound ($Cu_xSn_y$) such as $Cu_6Sn_5$. No nickel-tin compound is formed between the solder material 25 and the metal layer 24, and the material of the solder bumps is substantially a lead-free SnAgCu alloy.

The intermetallic compound 24' ($Cu_xSn_y$) has a hardness about 5-10% lower than that of the conventional intermetallic compound ($Ni_xSn_y$), and has a fracture toughness about 30-40% higher than that of the conventional intermetallic compound.

Therefore, by forming a copper layer (i.e., the metal layer 24) on the nickel layer 23, a preferred intermetallic compound, i.e., a copper-tin compound, is formed between the metal layer 24 and the solder material 25 during the reflow process. The copper-tin compound has a good bonding characteristic, and does not affect the mechanical strength, the lifetime and the fatigue strength of the solder bumps, thereby preventing cracking or delamination of the solder bumps and improving the product reliability.

In other embodiment, the metal layer 24 is made of one of gold, lead and silver. If the metal layer 24 is a gold or lead layer, when the solder material 25 is reflowed, the gold or lead material will be dissolved in the solder material 25 such that no intermetallic compound is formed. If the metal layer 24 is a silver layer, since the solder material 25 contains silver, the metal layer 24 can be regarded as a part of the solder material. Therefore, when the solder material 25 is reflowed, no intermetallic compound is formed. As such, the quality of the solder bumps is not affected by the metal layer 24.

Therefore, by forming a metal layer made of one of copper, gold, lead and silver on the nickel layer, the present invention prevents generation of nickel-tin compounds during a reflow process, thereby effectively avoiding cracking or delamination of solder bumps and improving the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An interconnection structure for being formed on bonding pads of
a substrate in a semiconductor package, comprising:
a nickel layer formed on each of the bonding pads;
a metal layer formed on the nickel layer, wherein the metal layer is made of one of gold, silver, and lead, and has a thickness in the range of 0.5 to 5 um; and
a solder material formed on the metal layer and being free from directly contacting the nickel layer.

2. The interconnection structure of claim 1, wherein the nickel layer has a thickness of 3 um.

3. The interconnection structure of claim 1, further comprising a titanium layer formed between the bonding pads and the nickel layer.

4. The interconnection structure of claim 3, wherein the nickel layer has a thickness greater than a thickness of the titanium layer.

5. The interconnection structure of claim 3, wherein the titanium layer has a thickness of 0.3 um.

6. The interconnection structure of claim 1, further comprising a copper layer formed between the bonding pads and the nickel layer.

7. The interconnection structure of claim 6, wherein the nickel layer has a thickness greater than a thickness of the copper layer.

8. The interconnection structure of claim 6, wherein the copper layer has a thickness of 0.3 um.

9. The interconnection structure of claim 1, further comprising a titanium layer formed between the bonding pads and the nickel layer, and a copper layer formed between the titanium layer and the nickel layer.

10. The interconnection structure of claim 9, wherein the nickel layer has a thickness greater than a thickness of the titanium layer and a thickness of the copper layer.

11. An interconnection structure for being formed on bonding pads of a substrate in a semiconductor package, comprising:
a nickel layer formed on each of the bonding pads;
a metal layer formed on the nickel layer, wherein the metal layer is made of one of gold, silver, and lead, and has a thickness in the range of 0.5 to 5 um; and
a solder material formed on the metal layer, wherein the solder material directly contacts the metal layer and is free from directly contacting the nickel layer.

\* \* \* \* \*